US009013019B2

(12) United States Patent
Rothman

(10) Patent No.: US 9,013,019 B2
(45) Date of Patent: Apr. 21, 2015

(54) AVALANCHE PHOTODIODE-TYPE SEMICONDUCTOR STRUCTURE AND PROCESS FOR PRODUCING SUCH A STRUCTURE

(71) Applicant: Commissariat a l'Energie Atomique et aux Ene Alt, Paris (FR)

(72) Inventor: Johan Rothman, Grenoble (FR)

(73) Assignee: Commissariat à l'Énergie atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 14/143,493

(22) Filed: Dec. 30, 2013

(65) Prior Publication Data
US 2014/0183683 A1    Jul. 3, 2014

(30) Foreign Application Priority Data
Dec. 31, 2012 (FR) ..................... 12 62990

(51) Int. Cl.
*H01L 31/10* (2006.01)
*H01L 31/107* (2006.01)
*H01L 31/18* (2006.01)

(52) U.S. Cl.
CPC .............. *H01L 31/107* (2013.01); *H01L 31/18* (2013.01); *H01L 31/1075* (2013.01)

(58) Field of Classification Search
CPC ................ H01L 31/02966; H01L 31/1832; H01L 31/107; H01L 31/1032
USPC ........................... 257/438; 438/87
See application file for complete search history.

(56) References Cited

U.S. PATENT DOCUMENTS

| | | | |
|---|---|---|---|
| 4,840,916 A * | 6/1989 | Yasuda et al. | 438/91 |
| 4,984,032 A | 1/1991 | Miura et al. | |
| 7,045,833 B2 | 5/2006 | Campbell et al. | |
| 7,348,608 B2 | 3/2008 | Ko et al. | |

FOREIGN PATENT DOCUMENTS

| | | |
|---|---|---|
| EP | 0 163 546 A2 | 12/1985 |
| EP | 0 325 532 A2 | 7/1989 |

OTHER PUBLICATIONS

U.S. Appl. No. 14/143,425, filed Dec. 30, 2013, Rothman.
(Continued)

*Primary Examiner* — Roy Potter
*Assistant Examiner* — Paul Patton
(74) *Attorney, Agent, or Firm* — Oblon, McClelland, Maier & Neustadt, L.L.P.

(57) ABSTRACT

Avalanche diode-type semiconductor structure (1) intended to receive electromagnetic radiation in a given wavelength. The structure (1) comprises a semiconductor multiplication zone (310) including a majority carrier concentration, and delimitation means suitable for laterally delimiting the multiplication zone (310). The delimitation means comprise a semiconductor zone (410) surrounding the multiplication zone (310) and comprising a forbidden energy gap greater than the forbidden energy gap of the major part (320) of the multiplication zone (310), said zone (410) having a type of conductivity opposite that of the multiplication zone (310) with a majority carrier concentration at least 10 times greater than that of the multiplication zone (310). The invention also relates to a process for producing an avalanche photodiode-type semiconductor structure.

15 Claims, 4 Drawing Sheets

(56) References Cited

OTHER PUBLICATIONS

French Preliminary Search Report issued Oct. 23, 2013, in French Application No. 12 62990 filed Dec. 31, 2012 (with English Translation of Categories of Cited Documents), 2 pages.

Anand Singh, et al., "HgCdTe avalanche photodiodes: A review", Optics & Laser Technology, vol. 43, No. 7, Mar. 7, 2011, 13 pages.

Johan Rothman, et al., "Short-Wave Infrared HgCdTe Avalanche Photodiodes", Journal of Electronic Materials, Published online Mar. 14, 2012, 9 pages.

French Preliminary Search Report issued Oct. 23, 2013, in French Application No. 12 62990 filed Dec. 31, 2012 (with English Translation of Categories of Cited Documents), 3 pages.

U.S. Appl. No. 14/359,216, filed May 19, 2014, Mollard, et al.

* cited by examiner

AVALANCHE PHOTODIODE-TYPE SEMICONDUCTOR STRUCTURE AND PROCESS FOR PRODUCING SUCH A STRUCTURE

TECHNICAL FIELD

The invention relates to the field of light detection and measuring devices.

In recent years, the application of microelectronic production methods to direct gap semiconductor materials, such as gallium arsenide and indium phosphide, have made it possible to improve the performance of optoelectronic structures.

Among these optoelectronic structures avalanche photodiodes have, among other things, thus had their sensitivity improved by a dark current reduction. These improvements nevertheless remain insufficient for certain applications such as single-photon detection at room temperature.

Thus, the dark current reduction in avalanche photodiodes remains a problem today.

The invention therefore relates more specifically to an avalanche photodiode-type semiconductor structure and to a process for producing such a structure.

PRIOR ART

The avalanche photodiodes dedicated to the measurement and detection of electromagnetic radiation currently used generally have an absorption region and a carrier multiplication region which are distinct from one another. Such photodiodes are called separate-absorption-and-multiplication photodiodes.

Such semiconductor structures comprise:
  a first semiconductor zone suitable for absorbing electromagnetic radiation by generating electron-hole pairs, the first zone being made of a semiconductor layer that extends longitudinally,
  a second semiconductor zone in contact with the first zone, the second zone being suitable for allowing, during operation of the structure, a multiplication of the carriers generated in the first zone, the second zone being arranged in a second semiconductor layer that extends along the first layer,
  a third semiconductor zone enabling the carriers to be collected.

To ensure a good delimitation of the zone on which the carriers are collected and thus ensure reproducibility of the measurements between the structures, it is known, in particular from the American U.S. Pat. No. 7,045,833, to provide the structures with means for delimiting the second zone. Such delimitation means make it possible to limit the region of the first zone on which the generated carriers will be collected and multiplied by the second zone.

Such delimitation means take the form of an etching of the lateral walls of the second zone so as to provide a perfect lateral delimitation. As the second zone has controlled dimensions, the region of the first zone in which the generated carriers are collected is itself perfectly controlled. This same delimitation also makes it possible to better define, in the second zone, the path of the carriers generated in the first zone, and therefore to obtain a multiplication rate and travel time of these same carriers that are controlled. The result is that such structures have controlled and reproducible performances with a clearly defined response time.

Nevertheless, such delimitation means generate crystal defects that produce a non-negligible dark current. Such a structure comprising such delimitation means therefore has a signal-to-noise ratio that is reduced due to the dark current, which therefore limits its application in the measurement and detection of relatively intense electromagnetic radiation. It is also possible to add to this the need for a deep etching step in order to etch the walls of the second zone, this step making the process of producing such a structure more complex.

It is known from the American U.S. Pat. No. 7,348,608, in order to limit the influence of such crystal defects, to form, in addition to the lateral etching of the wall of the second zone, a so-called guard ring. Such a guard ring is intended to reduce the electric field in particular at the level of the wall of the second zone, incidentally enabling the carrier current at this same wall to be reduced, by the formation of a region implanted either by doping elements or by passivating elements, such as hydrogen, suitable for rending the region semi-insulating.

Nevertheless, even if such a guard ring enables the influence of the etched walls of the second zone to be limited, it can also be the origin of leakage currents that also limit the signal-to-noise ratio of a structure comprising such a guard ring. In addition, the combined use of etching of the walls of the second zone and a guard ring-type region involves a large number of production steps.

DESCRIPTION OF THE INVENTION

The present invention is intended to overcome these disadvantages.

The invention is therefore intended to provide an avalanche photodiode-type structure having an improved signal-to-noise ratio with respect to an avalanche photodiode-type structure comprising prior art's means for lateral delimitation of the second zone.

To this end, the invention relates to an avalanche photodiode-type semiconductor structure intended to receive electromagnetic radiation in a given wavelength and comprising:
  a first semiconductor zone, called an absorption zone, with a first type of conductivity having a first face intended to receive the electromagnetic radiation and a second face opposite the first face, the semiconductor material with which said first zone is formed having a forbidden energy gap suitable for allowing electromagnetic radiation to be absorbed by said first zone,
  at least one second semiconductor zone, called a multiplication zone, in contact on a first longitudinal face with the second face of the first zone, the second zone having a majority carrier concentration lower than that of the first zone, and being suitable for multiplying the carriers by impact ionization,
  a third semiconductor zone, called a collection zone, in contact with the second semiconductor zone, said third zone having a second type of conductivity opposite the first type of conductivity and having a majority carrier concentration higher than that of the second semiconductor zone,
  delimitation means suitable for laterally delimiting the second zone,
  the delimitation means comprising a fourth semiconductor zone surrounding the second zone and comprising a forbidden energy gap of energy higher than that of a major part of the second zone, said fourth zone having the first type of conductivity.

Such delimitation means make it possible to limit the second zone without requiring the etching of the lateral walls of the second zone, the delimitation being provided by a fourth semiconductor zone. In addition, such a fourth zone makes it possible to offer electrical delimitation of the second zone provided by a high concentration of majority carriers of the first type, with a reduction in the dark current generated at this fourth zone due to a forbidden energy gap of said fourth zone increased with respect to that of the second zone. In effect, with such an increase in the forbidden energy gap, the probability of thermal generation of electron-hole pairs at the origin of the dark current noise is reduced. Thus, such a structure has a reduced dark current with respect to an avalanche photodiode-type structure of the prior art.

The second zone may have a majority carrier concentration at least 10 times lower than that of the first zone.

The third zone may have a majority carrier concentration at least 10 times greater than that of the second semiconductor zone.

The fourth zone may have a majority carrier concentration at least 10 times greater than that of the second zone.

The fourth zone is preferably in contact with the first zone.

The electrical delimitation between the two zones makes it possible to limit the capacity of the structure as well as to avoid cross-talk between two adjacent structures in a photodetector array. It also makes it possible to avoid a concentration of the electric field at the corners of the second zone, which could reduce the sensitivity of the structure by generating a tunnel current.

By "major part of the second zone", we mean a part of the second zone comprising at least half, and even two-thirds or preferably 90% of the second zone and capable of containing the entire second zone.

The forbidden energy gap is greater than the forbidden band of the second zone by at least 0.1 eV and preferably 0.2 eV.

The second and fourth zones can both essentially be formed by at least three of the same elements, said at least three elements being adapted so that the variation in the proportion of at least one of said at least three elements causes a forbidden energy gap variation, the respective proportions of said at least one element of the second and fourth zone being adapted so that the fourth zone has a forbidden energy gap greater than that of the second zone.

Such a possibility enables the fourth and second zones to be formed simply by modifying the proportion of the at least one element. In addition to simplifying the process for producing such a structure, such a possibility enables, for sufficiently reduced variations in the proportion of the at least one element, the interface defect problems between these two zones to be limited, and therefore the dark current at the origin of such defects to be limited.

The at least three elements can be tellurium, cadmium and mercury, the cadmium proportion of the second and the fourth zone being adapted so that the fourth zone has a forbidden energy gap greater than that of the second zone.

By "cadmium proportion", as used above and in the remainder of this document, we mean the proportion x of cadmium in a mercury-cadmium telluride of the $Cd_xHg_{1-x}Te$ type with value x corresponding to the proportion of cadmium with respect to mercury.

The use of tellurium, cadmium and mercury to form the second and fourth zone makes it possible to form these zones with mercury-cadmium tellurides that have, among other advantages, that of having a reduced variation in the lattice parameter even for significant variations in the cadmium proportion. A reduced variation in the lattice parameter makes it possible to limit crystal defects at the interface between the fourth and the second zone. In addition, the use of a second zone made of a mercury-cadmium telluride makes it possible to provide a carrier multiplication zone, the latter making it possible to multiply, by impact ionization, substantially only the electrons as demonstrated in the work of J. Rothman et al. published in the Journal of Electronic Material No 40, page 1757, published in 2011. With such a carrier multiplication selectivity, the structure has, with respect to a structure not having such a selectivity, better control of the multiplication rate, which improves the photon signal-to-noise ratio and reduces the response time.

The structure can also comprise an adaptation layer and a passivation layer, the adaptation layer comprising a part, called a minor part, of the second zone and being in contact with a part, called a major part, of the second zone, this same adaptation layer having a forbidden energy gap of which the energy is between that of the forbidden band of the passivation layer and that of the forbidden band of the major part of the second zone.

Such an adaptation layer in addition to the passivation layer makes it possible to passivate the surface of the structure with an impact of the passivation layer on the electrical characteristics of the structure reduced by the use of the adaptation layer, which enables a gradual gap opening.

The adaptation layer can be made of a mercury-cadmium telluride of the $Cd_xHg_{1-x}Te$ type of which the cadmium proportion x is greater than that of the major part of the second zone.

The use of an adaptation layer having a cadmium proportion greater than that of the major part of the second zone makes it possible to establish a structure production process using, for the formation of the fourth zone, the diffusion of the cadmium of the adaptation layer. In effect, with such an adaptation layer, it is possible to form the fourth zone directly by implanting, with arsenic or another type of doping element promoting the diffusion of cadmium, the lateral edges of the part of the structure that is intended to form the fourth zone and perform an activation annealing of the arsenic or other doping element. Such an annealing leads to diffusion of the cadmium of the adaptation layer to the implanted zone thus increasing the proportion of cadmium, and, by the same token, the forbidden energy gap of the implanted structure part. The zone thus formed has, owing to the activation of the arsenic or other doping element, and the diffusion of the cadmium, a majority carrier concentration and a forbidden energy gap greater than those of the part of the structure in which it was formed.

The adaptation layer can comprise at least a part of the third semiconductor zone.

The adaptation layer can comprise the entire third zone.

There may be first and second polarization means suitable for polarizing, respectively, the third and the first semiconductor zones, the second polarization means comprising the fourth zone and an electric contact in electrical contact with the fourth zone, the fourth zone enabling the first zone and the electric contact to be electrically connected.

With such a second means, it is not necessary to provide the electric contact enabling the polarization of the first zone directly in contact with the first zone, as it is offset at the fourth zone.

The delimitation means may also comprise a cavity laterally surrounding, over at least a part of its thickness, the second zone, the fourth zone being between the cavity and the second zone.

Such a cavity makes it possible to adapt a fourth zone on which an implantation step over the entire height of the structure cannot be envisaged, such as, for example, a structure comprising a second zone with a high thickness. In effect, the arrangement of a cavity in the structure prior to an implantation step in order to form the fourth layer makes it possible to reduce the thickness of the structure that must be implanted since there can be only a low thickness around the periphery of the cavity.

The second zone may be suitable for providing a carrier multiplication by impact ionization, which is predominant for one type of carrier and negligible for the other type of carrier, and the second zone may comprise at least two sub-parts of its major part, the first sub-part by which the second zone is in contact with the first zone, the second sub-part being adapted so as to have a mean carrier multiplication rate per micrometer greater than the mean carrier multiplication rate per micrometer of the first sub-part, and preferably greater than 3 times, 5 times or even 10 times the mean carrier multiplication rate per micrometer of the first sub-part.

Thus, the carriers generated in the first zone, during their transit toward the second zone, pass one at a time through the first sub-part and the second sub-part. The first sub-part, having a reduced multiplication rate per micrometer, makes it possible to increase the carrier current with a steady signal-to-noise ratio. The carrier current is thus slightly increased with a signal-to-noise ratio that remains steady. The carrier current then transits through the second sub-part in which it is significantly increased by the high multiplication rate per micrometer of the second sub-part.

Above and in the remainder of this document, by "mean carrier multiplication rate per micrometer in one of the first and second zones", we mean the multiplication rate per micrometer in said zone when the structure is operating, i.e. when it is polarized under a nominal operating voltage such as, for example, 12 V.

The second zone can be suitable for providing a carrier multiplication by impact ionization that is predominant for one type of carrier and negligible for the other type of carrier, and the second zone can comprise at least two sub-parts of its major part, the first sub-part by which the second zone is in contact with the first, the second sub-part being adapted so as to have a carrier multiplication rate greater than the carrier multiplication rate of the first sub-part, and preferably greater than 3 times, 5 times or even 10 times the carrier multiplication rate of the first sub-part, the first and second parts having a thickness on the same order of amplitude.

Above and in the remainder of this document, by "carrier multiplication rate in one of the first and second zones", we mean the multiplication rate in said zone when the structure is operating, i.e. when it is polarized under a nominal operating voltage such as, for example, 12 V.

The dark noise generated in this second sub-part, if it is significantly high with respect to that generated in the first sub-part, remains reduced with respect to the carrier current after it has been increased by its passage into the first sub-part. Thus, the structure has a high multiplication rate per micrometer of the carrier current, which is the product of that of the first sub-part and that of the second sub-part, with a signal-to-noise ratio that remains steady and that is on the order of the signal-to-noise ratio at the output of the first sub-part. Such a structure thus has improved sensitivity with respect to a structure according to the prior art.

The second sub-part may be made of a semiconductor material having a forbidden energy gap lower than that of the semiconductor material with which the first sub-part is made so as to have a mean carrier multiplication rate per micrometer greater than that of the first sub-part.

Such a variation in the forbidden energy gap between the first and second sub-parts of the second zone makes it possible to provide a first and a second sub-part with mean carrier multiplication rates per micrometer that are different from one another.

The first and the second sub-part can be made of mercury-cadmium tellurides of the $Cd_xHg_{1-x}Te$ type with cadmium proportions x different from one another.

A first and a second sub-part made of mercury-cadmium tellurides make it possible to provide a major part of the second zone which, while having a carrier multiplication by impact ionization that is predominant for electrons with the second sub-part with a forbidden energy gap lower than that of the first sub-part, comprises an interface between the first and second sub-part substantially free of crystal defects. In effect, the mercury-cadmium tellurides enable a significant variation in the forbidden energy gap by varying the cadmium proportion without a significant variation in the crystal lattice parameters.

The first and the second sub-part can have substantially identical majority carrier concentrations. The first and second sub-part of the first zone can have the second type of conductivity.

The first sub-part can have the first type of conductivity, with the second sub-part having the second type of conductivity.

The first and the second sub-part can have the first type of conductivity.

The first and the second sub-parts can be made of the same semiconductor material and have the second type of conductivity with a majority carrier concentration on the same order of amplitude, the first and second sub-parts being separated from one another by an interface zone with the first type of conductivity of which the majority carrier concentration is suitable for modifying the distribution of the electric field in the second sub-part so that the latter has a mean carrier multiplication rate per micrometer greater than that of the first sub-part, the mean carrier multiplication rate per micrometer preferably being greater than at least 3 times and preferably 5 times, and even 10 times, that of the first sub-part.

The mean carrier multiplication rates per micrometer, different for the first and second sub-parts in such a structure, are thus obtained without the need to use different materials to form the two sub-parts, thereby limiting the risk of appearance of crystal defects at the interface of these two sub-parts, this type of defect generally being associated with an interface between two materials having a significant crystal lattice difference.

The semiconductor material of which the first zone is formed can be a mercury-cadmium telluride of which the cadmium composition is varied to promote the absorption of radiation, and in which the first zone comprises a doping element providing at least one majority carrier corresponding to the first type of conductivity, the concentration of said doping element being varied alternately in a direction substantially perpendicular to the first longitudinal face between a so-called low concentration and a so-called high concentration.

The use of a first zone comprising a doping element concentration that is varied alternately in a direction substantially perpendicular to the first longitudinal face makes it possible to ensure that the diffusion of cadmium in said first zone during the activation anneal of the doping element remained low, since this diffusion is directly related to the high concentrations of doping element. Thus, the parts of the first zone that have such a doping configuration act as a barrier to the diffusion of cadmium and enable the structure to have a cadmium proportion that is varied along the substantially perpendicular direction in spite of the use of the doping element.

The doping element providing at least one majority carrier can be arsenic.

The doping element providing at least one majority carrier can be gold Au or antimony Sb.

The first zone can comprise a cadmium proportion x that is reduced in the direction of the second zone along an axis substantially perpendicular to the first longitudinal face.

Such a variation in the cadmium proportion x in the first zone makes it possible to create an electric field along the first zone. This electric field in the first zone has the effect of accelerating the carrier diffusion in the direction of the second zone and therefore makes it possible to reduce the response time of the structure with respect to a structure not having such a variation in the cadmium proportion x.

The low concentration of doping element can be substantially zero.

Such a low concentration makes it possible to limit the risk of diffusion of the cadmium during the activation anneal in the portions of the first zone comprising the low concentration of doping element. Thus, the structure can comprise a variation in the cadmium proportion x in the first zone at least at the parts of this first zone comprising the low concentration of doping element.

The alternation between the low concentration and the high concentration in the first zone can be substantially periodic.

Each period can comprise a first part corresponding to the high concentration and a second part corresponding to the low concentration, with the dimensional ratio between the first part and the second part in the direction substantially perpendicular to the longitudinal face being a maximum of 10.

Such a dimensional ratio between the first and the second part of each period makes it possible to ensure a low series resistance. In effect, with such a dimensional ratio, the majority carriers provided by the second zone make it possible to ensure good conduction both in the second part and in the first part, ensuring good conduction over the entire thickness of the first zone.

The first zone can be in contact with the second zone by a region substantially free of doping element.

The region of the first zone by which the first zone is in contact with the second zone can comprise a cadmium proportion x that is varied in the direction of the second zone.

The invention also relates to a process for producing an avalanche photodiode-type structure, said process comprising the steps consisting of:
providing a support comprising a first semiconductor zone with a first type of conductivity having a first face intended to receive the electromagnetic radiation and a second face opposite the first face, the semiconductor material of which said first zone is made having a forbidden energy gap adapted so as to allow the absorption of the electromagnetic radiation in said first zone,
forming at least one second semiconductor zone in contact on a first longitudinal face with the second face of the first zone, the second zone having a majority carrier concentration at least lower than that of the first zone,
forming a third semiconductor zone in contact with the second semiconductor zone, said third zone having a second type of conductivity opposite the first type of conductivity and having a majority carrier concentration greater than that of the second semiconductor zone,
forming a fourth semiconductor zone surrounding the second zone and comprising a forbidden energy gap greater than the forbidden energy gap of the major part of the second zone, said fourth zone having the first type of conductivity with a majority carrier concentration greater than that of the second zone, said fourth zone forming means for delimiting the second zone.

Such a production process makes it possible to produce a semiconductor structure of the photodiode type having an improved signal-to-noise ratio with respect to an avalanche diode-type structure of the prior art.

In the step of forming the fourth zone, the fourth zone can be formed so as to entirely surround the second zone.

The structure can comprise an adaptation layer, and the first and second zones as well as the adaptation layer are made of mercury-cadmium telluride of the $Cd_xHg_{1-x}Te$ type and the step of forming the second zone can comprise the sub-steps consisting of:
forming the adaptation layer in contact with a major part of the second semiconductor zone, the cadmium proportion x being adapted so that the adaptation layer has a forbidden energy gap greater than that of the second zone,
implanting the portions of the structure intended to form the fourth zone with arsenic so as to provide a majority carrier concentration greater than that of the second semiconductor zone,
performing an activation anneal so as to diffuse a part of the cadmium from the adaptation layer in said portions of the structure so as to form the fourth zone.

Such a process enables a photodiode-type semiconductor structure to be formed with means for lateral delimitation of the second zone formed with an easy-to-implement process, the formation of the fourth zone being obtained by a single step of arsenic implantation and an arsenic activation anneal.

The step of providing the second zone can comprise a sub-step consisting of forming a major part of the second zone in contact with the first zone, the major part comprising a first sub-part by which the second zone is in contact with the first zone and a second sub-part connecting the first sub-part to the third zone, the second sub-part being suitable for having a mean carrier multiplication rate per micrometer greater than the mean carrier multiplication rate per micrometer of the first sub-part, and preferably greater than 3 times, 5 times and even 10 times the mean carrier multiplication rate per micrometer of the first sub-part.

Such a step of providing the second part makes it possible to provide an avalanche photodiode that has a signal-to-noise ration increased with respect to a structure having an identical carrier multiplication gain and comprising a second part produced according to the step of forming a second part according to the prior art.

The step of providing the support with the first zone may consist in particular of providing a first semiconductor zone with a first type of conductivity having a first longitudinal face intended to receive the electromagnetic radiation and a second face opposite the first face, said first zone being made of mercury-cadmium telluride of the $Cd_xHg_{1-x}Te$ type with a cadmium proportion x that is varied, the first zone comprising a doping element of which the concentration is varied alternately in a direction substantially perpendicular to the longitudinal face between a so-called low concentration and a so-called high concentration.

Such a step of providing the support makes it possible to provide a structure with a first layer that, in spite of the use of the doping element, has a cadmium proportion that is varied.

The doping element can be arsenic.

BRIEF DESCRIPTION OF THE DRAWINGS

The present invention will be easier to understand in view of the following description of embodiments, provided solely as and indication and which are in no way limiting, with reference to the appended drawings, wherein.

Identical, similar or equivalent parts of the different figures have the same numeric references so as to facilitate reading from one figure to another. The different parts shown in the figures are not necessarily shown according to a uniform scale, so that the figures are easier to read.

The different possibilities (alternatives and embodiments) must be understood as being non-mutually exclusive and are capable of being combined with one another.

DETAILED DESCRIPTION OF SPECIFIC EMBODIMENTS

Figure 1:
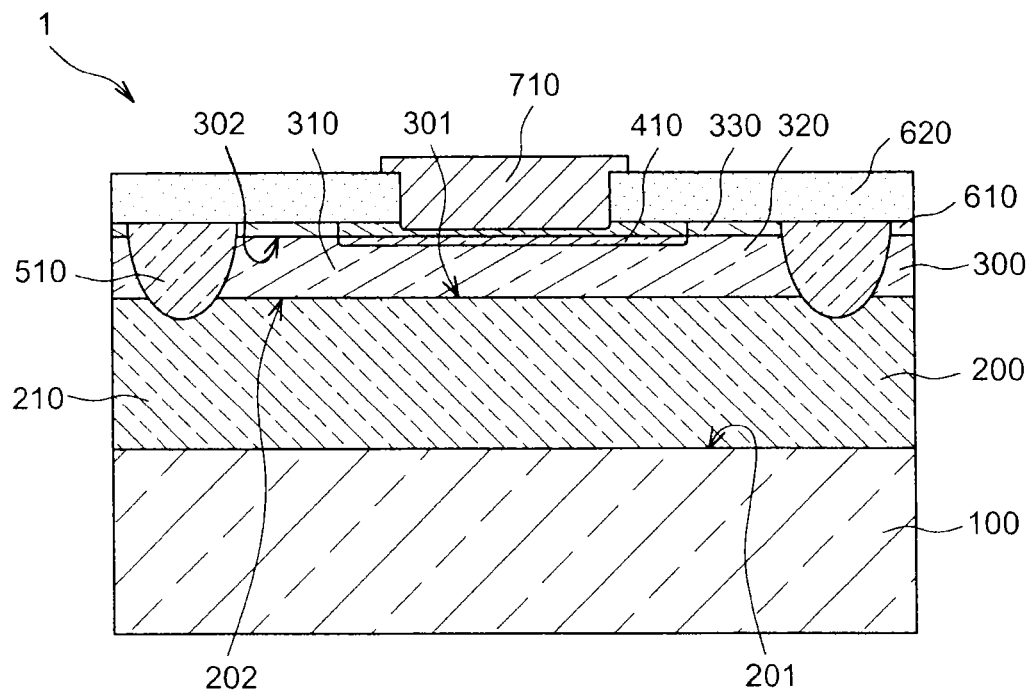
FIG. 1 shows a transverse cross-section view of a structure according to a first embodiment in which the structure comprises a third semiconductor zone that is not included in the adaptation layer.

FIG. 1 shows a semiconductor structure 1 according to a first embodiment, said structure 1 being intended for the detection and measurement of electromagnetic radiation of which the wavelength is in a given range of wavelengths.

To illustrate and facilitate the understanding of the operation of the invention, the values and the materials that are cited above, when specified, concern a specific application of the invention to the detection and measurement of electromagnetic radiation of which the wavelength is in the near infrared wavelength range. Of course, the values and the materials concerning this application are provided only as an illustration and are not limiting.

Above and in the remainder of this document, by "near infrared wavelength range", we mean a range of wavelengths of between 1.5 µm and 5 µm.

A structure 1 according to the first embodiment of the invention comprises:
- a support 100,
- a first semiconductor zone 210 with a first type of conductivity having a first face 201 intended to receive the electromagnetic radiation and a second face 202 opposite the first face 201, said first zone 210 comprising a forbidden energy gap suitable for promoting the absorption of the electromagnetic radiation in the given wavelength range,
- a second semiconductor zone 310 in contact by a first longitudinal face 301 with the second face 202 of the first zone 210,
- a third semiconductor zone 410 in contact with the second semiconductor zone 310, said third zone 410 having a second type of conductivity opposite the first type of conductivity,
- a fourth semiconductor zone 510 surrounding the second zone 310 and comprising a forbidden energy gap greater than that of the second zone 310, said fourth zone 510 having the first type of conductivity,
- an electric contact 710 in contact with the third zone 410 and suitable for polarizing the third zone 410, the electric contact forming first polarization means,
- second polarization means, not shown, suitable for polarizing the first zone,
- an adaptation layer 610 in contact with the major part 320 of the second zone 310 and comprising a part of the third zone 410,
- a passivation layer 620 in contact with the adaptation layer 610.

The support 100 is a support suitable for forming the first zone 210 and is at least partially transparent in the given wavelength range. Thus, the support 100 can be made of an insulating or semiconductor material of which the forbidden energy gap is adapted so as to be greater than the energy of the photons of an electromagnetic radiation of which the wavelength is in the given wavelength range.

In the specific application, the support 100 can be made of zinc-cadmium telluride CdZnTe. In effect, the zinc-cadmium telluride CdZnTe material has a forbidden band energy of at least 1.4 eV, and is therefore transparent to the infrared and relatively insensitive to thermal noise.

The support 100 has a first and a second face, the first face being the face that is intended to receive the electromagnetic radiation.

The structure 1 also comprises a first semiconductor layer 200 in contact with the support 100. The first layer 200 is made of a semiconductor material of which the forbidden energy gap is suitable for allowing the absorption of electromagnetic radiation of which the wavelength is in the given wavelength range. Thus, the first layer 200 in a semiconductor material comprising a forbidden energy gap of which the energy is below the energy of the photons of an electromagnetic radiation of which a wavelength is in the given wavelength range.

The first layer 200 has a first type of conductivity. The first type of conductivity is chosen from the type of conductivity for which the majority carriers are electrons and the type of conductivity for which the majority carriers are holes.

The thickness of the first layer 200 is adapted so that a major part of the radiation received by the first face of the structure 1 at the first zone 210 is absorbed by the first zone 210.

In the specific application, the first layer 200 is made of a mercury-cadmium telluride $Cd_xHg_{1-x}Te$ of which the cadmium proportion x is between 0.33 and 0.6. With a cadmium proportion of 0.33 and 0.6, the first layer is suitable for absorbing, at a temperature of 300 K, electromagnetic radiation in the wavelength range respectively below 3.7 µm and 1.8 µm.

In this specific application, the first type of conductivity is the type of conductivity for which the majority carriers are holes. The majority carrier concentration in the first layer 200 is preferably between $10^{16}$ and $10^{17}$ cm$^{-3}$. According to this application, the first layer 200 has a thickness of between 0.5 and 2 µm. The first layer, in order to obtain the first type of conductivity, comprises doping elements, such as arsenic As, gold Au or antimony Sb, suitable for providing at least one carrier corresponding to the first type of conductivity when they are activated.

The part of the first layer 200 in which the electron-hole pairs at the origin of the signal of the structure are generated forms the first zone 210 of the structure 1.

The first layer 200 has a first and a second face 201, 202, the first face 201 being the face by which the first layer 200 is in contact with the support 100. The first layer 200 is in contact by its second face 202, which is opposite its first face 201, with a second semiconductor layer 300. The second layer 300 comprises a first longitudinal face 301 by which it is in contact with the second face 202 of the first layer 200.

The second layer 300 is a semiconductor layer of which a portion forms the major part 320 of the second zone 310, called the multiplication zone. The portion of the second layer 300 that forms the major part 320 of the second zone 310 is thus suitable for, during operation of the structure 1, forming a carrier multiplying layer. To obtain such an adaptation, the portion of the second semiconductor layer 300 that forms the major part 320 of the second zone 310 comprises a majority carrier concentration that is at least 10 times lower than that of the first zone 210 and preferably 50 times lower. The second layer 300, according to the operating constraints of the structure 1 can have the first type of conductivity or a second type of conductivity that is opposite the first type of conductivity.

According to another possibility of the invention, the portion of the second layer 300 that forms the major part 320 of the second zone 310 can be of the intrinsic type or of the unintentionally doped type.

By "intrinsic type", we mean that the part of the second layer 300 that partially forms the second zone 310 comprises a concentration of carriers of a first type that is substantially identical to the concentration of carriers of a second type, which is opposite the first type of carrier.

By "unintentionally doped type", we mean that the majority carrier concentration in the portion of the second layer 300 that forms the major part 320 of the second zone 310 is the concentration corresponding to a material in which doping elements, i.e. elements suitable for providing carriers, have not intentionally been introduced. The majority carrier concentration and the type of conductivity of a zone of the unintentionally doped type are linked to the process for forming said zone.

The second layer 300, at least for its portion that forms the major part 320 of the second zone 310, has a forbidden energy gap that is suitable for optimizing, during operation of the structure 1, the carrier multiplication rate during their transit in said second layer 310, for at least one type of carrier.

Similarly, the thickness of the second layer 300 is great enough for the structure 1 to have a multiplication rate of carriers generated in the first layer 200 suitable for providing a measurable signal.

In the specific application, the portion of the second layer 300 that forms the major part 320 of the second zone 310 is made of a mercury-cadmium telluride $Cd_xHg_{1-x}Te$ of which the cadmium proportion x is between 0.42 and 0.2 and preferably between 0.32 and 0.2 in order to provide a second wavelength range including thermal radiation. In this same specific application, the second layer 300, at least over its portion forming the major part 320 of the second zone 310, has a type of conductivity opposite that of the first zone 210, and is therefore a type of conductivity in which the majority carriers are electrons. The majority carrier concentration of the portion of the second layer 300 forming the major part 320 of the second zone 310 is between $10^{14}$ and $10^{15}$ cm$^{-3}$. The majority carrier concentration of the portion of the second layer 300 forming the major part 320 of the second zone 310 is therefore actually below that of the first zone 210, in this case ten times lower, or ten times smaller.

Above, by "thermal radiation", we mean the mid- to far-infrared wavelength range between 3 and 10 µm.

According to this specific application, the thickness of the second layer 300 is between 0.5 and 2 µm.

The second semiconductor layer 300 also comprises the major part of the fourth semiconductor zone 510. The fourth zone 510 surrounds and laterally delineates the second zone 310.

The second semiconductor layer 300 comprises a second face 302 that is opposite the first longitudinal face 301. The second layer 300 is in contact by its second face 302 with the adaptation layer 610.

The adaptation layer 610 is a third semiconductor layer that is suitable for forming a good interface between the second semiconductor layer 300 and the passivation layer 620. To this effect, the adaptation layer 610 has, excluding its portion comprising the fourth zone 510, an intermediate forbidden energy gap between that of the major part 320 of the second zone 310 and the forbidden energy gap of the passivation layer 620.

The adaptation layer 610, excluding its portion forming a part of the fourth zone 510 has the second type of conductivity. The adaptation layer 610 comprises, excluding its portion forming the third semiconductor zone 410 and a portion forming a part of the fourth zone 510, a majority carrier concentration that is of the same order of amplitude as that of the major part 320 of the second zone 310 and preferably substantially equal to that of the major part 320 of the second zone 310. Thus, the adaptation layer 610 comprises a minor part 330 of the second semiconductor zone 310 by which the second zone 310 is in contact with the passivation layer.

The second multiplication zone 310 is essentially formed by the portion 320 of the second layer 300 located between the fourth lateral delimitation zones 510, called the major part 320 of the second zone 310. It can also include a portion 330 of the adaptation layer 610 called the minor part 330 of the second zone 310.

In the specific application, the adaptation layer 610 is made of a mercury-cadmium telluride $Cd_xHg_{1-x}Te$ of which the cadmium proportion x between 0.7 and 0.4. In this same specific application, the adaptation layer 610, excluding its part forming a part of the fourth zone 510, has the same type of conductivity as that of the second zone 310 and therefore has a type of conductivity for which the major carriers are electrons. The major carrier concentration is substantially equal to that of the second zone 310 and is therefore between $10^{14}$ and $10^{15}$ cm$^{-3}$.

The adaptation layer 610 comprises a part of the third semiconductor zone 410. The third zone 410 is partially formed in the second layer 300, in contact with the second zone 310, with the remainder of the third zone 410 being in the adaptation layer 610. The third zone 410 has a variable forbidden energy gap corresponding to that of the layers with which it is formed.

According to one of the possibilities of the invention not shown, the adaptation layer 610 can be comprised of a composition so that the adaptation layer has a forbidden energy gap gradually increasing in the direction of the passivation layer 620. Such a possibility is particularly advantageous in that it makes it possible to limit the presence of defects between the second layer 300 and the passivation layer 620.

The adaptation layer 610 also comprises a part of the fourth zone 510.

The fourth zone 510 extends over the entire thickness of the second layer 300 and the adaptation layer 610. The fourth zone 510 is in contact with the first semiconductor layer 200.

The fourth semiconductor zone 510 is a semiconductor zone that has a forbidden energy gap greater than that of the major part of the second zone.

The fourth zone 510 has the first type of conductivity and has a majority carrier concentration that is at least 10 times greater than that of the second semiconductor zone.

According to an advantageous possibility of the invention, the majority carrier concentration of the second zone 510 is more than 50 times that of the second zone 310.

According to an advantageous possibility of the invention, the forbidden energy gap of the fourth zone 510 is greater than that of the major part 320 of the second zone 310 by at least 0.1 eV and preferably 0.2 eV.

In the specific application, the fourth zone 510 is made of a mercury-cadmium telluride $Cd_xHg_{1-x}Te$ with a cadmium proportion that is between 0.6 and 0.4. In this same application, the fourth zone 510 has a conductivity of the type in which the majority carriers are holes with a majority carrier concentration of between $5.10^{17}$ and $10^{18}$ $cm^{-3}$. According to the specific application, the doping element that provides the majority carriers in the fourth zone 510 is arsenic (As).

The fourth zone 510 forms means for delimiting the second zone 310 suitable for laterally delimiting the second zone 310.

The adaptation layer 610 also comprises a part of the third semiconductor zone 410. The third zone 410 also comprises a part in the second semiconductor layer 300 by which it is in contact with the major part 320 of the second zone 310.

The third zone 410 has the second type of conductivity. The third zone 410 comprises a majority carrier concentration at least 10 times, and preferably 50 times, greater than that of the second zone 310.

The third zone 410 is separated from the fourth zone 510 by the second zone 310. Preferably, the minimum dimension of the space formed by the second zone 310 in order to separate the third zone 410 and the fourth zone 510 is suitable for limiting electrical interactions between these two same zones 410, 510.

Thus, with regard to the specific application, the second zone 310 is suitable for forming, between the third zone 410 and the fourth zone 510, a separation that is typically greater than 2 μm. According to this same possibility, the separation formed by the second zone 310 between the third zone 410 and the fourth zone is generally less than 10 μm.

In the specific application, the third zone 410 has the same type of conductivity as that of the second zone 310. The majority carrier concentration is between $10^{16}$ and $10^{18}$ $cm^{-3}$.

The adaptation layer 610 is in contact on its face that is opposite the second layer 300 with the passivation layer 620.

The passivation layer 620 extends along the adaptation layer 610. The passivation layer 620 is preferably made of an insulating material, such as, for example, silicon oxide.

The passivation layer 620 has a through-opening communicating with the part of the adaptation layer 610 comprising the third zone 410.

In the specific application, the passivation layer 620 is made of zinc sulfide ZnS.

The electric contact 710 is in contact with the third zone 410 through the opening provided in the passivation layer 620.

The electric contact 710 is made of a conductive material, generally metallic, suitable for forming an ohmic contact with the third semiconductor zone 410.

It can finally be noted that the structure 1 also comprises, while not shown in FIG. 1, second polarization means, which can be an electric contact passing through the passivation layer 620, the adaptation layer 610 and the second semiconductor layer 300 so as to be in electrical contact with the first semiconductor layer 200. As the first semiconductor layer 200 generally has a majority carrier concentration sufficient for making it conductive, the structure 1 is one of a plurality of structures, the second means can be a second collective electric contact suitable for polarizing a plurality of structures.

Such a structure 1, when it is a structure according to the specific application, can be formed by a production process comprising the steps consisting of:

providing a semiconductor support 100 and the first semiconductor layer 200, the first semiconductor layer 200 having the first type of conductivity and comprising a first and a second face 201, 202, the first layer comprising a first semiconductor zone 210, forming, in contact with the second face 202 of the first layer 200, the second semiconductor layer 300, the second layer 300 having the second type of conductivity and comprising a first and a second face 301, 302, the second layer 300 being in contact with the first layer 200 by its first longitudinal face 301, the second layer 300 comprising a major part 320 of a second semiconductor zone 310, forming the adaptation layer 610 in contact with the second face 302 of the second semiconductor layer 300, the adaptation layer 610 having the second type of conductivity and comprising a first and a second face, the adaptation layer 610 being in contact with the second layer 300 by its second longitudinal face 302, the adaptation layer 610 comprising a minor part 330 of the second zone 310 and thus making it possible to form, with the part 320 of the second layer 300, the second zone 310, selectively implanting the parts of the adaptation layer 610 and the second semiconductor layer 300 intended to form the fourth zone 510 with arsenic (As) so that the fourth zone 510 has the first type of conductivity; this implantation is preferably performed so as to entirely surround the second zone 310, i.e. so as to be in contact with the second layer 200, performing an anneal at a temperature high enough to activate the arsenic so as to release the majority carriers, such an anneal resulting in a diffusion in the fourth zone 510 of a part of the cadmium present in the first semiconductor layer 200 and in the adaptation layer 610, so as to thus increase the forbidden energy gap in the portions intended to form the fourth zone 510, thereby enabling the fourth zone 510 to be formed, forming the passivation layer 620 on the face of the adaptation layer 610 that is opposite the second semiconductor layer 300, selectively implanting, with different doping elements, the portions of the adaptation layer 610 and the second semiconductor layer 300 that are intended to form the third semiconductor zone 410 and thus form the third semiconductor zone 410, forming, in the passivation layer 620, a through-opening communicating with the third semiconductor zone 410, forming the electric contact 710 through the opening of the passivation layer 620 and in electrical contact with the third semiconductor zone 410, forming the second polarization means suitable for polarizing the first semiconductor zone 210.

In operation, the structure 1 has a high reverse polarization, i.e. for a first and a third zone 210, 410 each having a type of conduction in which the majority carriers are respectively holes and electrons, the first zone 210 is highly negatively polarized with respect to the third zone 410. Thus, the semiconductor junction located at the interface between the first and the second zone 210, 310, and the second zone 310 having a low majority carrier concentration with respect to the first zone 210, the drop in potential is distributed primarily along the second semiconductor zone 310.

When a photon of electromagnetic radiation of which the wavelength is within the given wavelength range enters the first zone 210, its absorption generates, in the first zone 210, an electron-hole pair. The electron and the hole thus generated are separated from one another by the electric field present in the structure, and the electron passes through to the second semiconductor zone 310.

In the second zone 310, due to the material that comprises it and the electric field there, the electron will produce multiple impact ionizations and therefore form a current of multiple electrons, which is then collected by the third zone 410.

As the structure has, owing to its fourth zone 510, a good delimitation of its second zone 310, the path of the electron in the second zone is clearly defined. Thus, as the electron multiplication gain in the second zone 310 is directly dependent upon the path, the current obtained for an electron generated in the first zone 210 is clearly defined. In addition, as the fourth zone 510 has a good interface with the second zone 310, the dark current remains steady and therefore enables a high-quality signal-to-noise ratio to be obtained.

Figure 2:
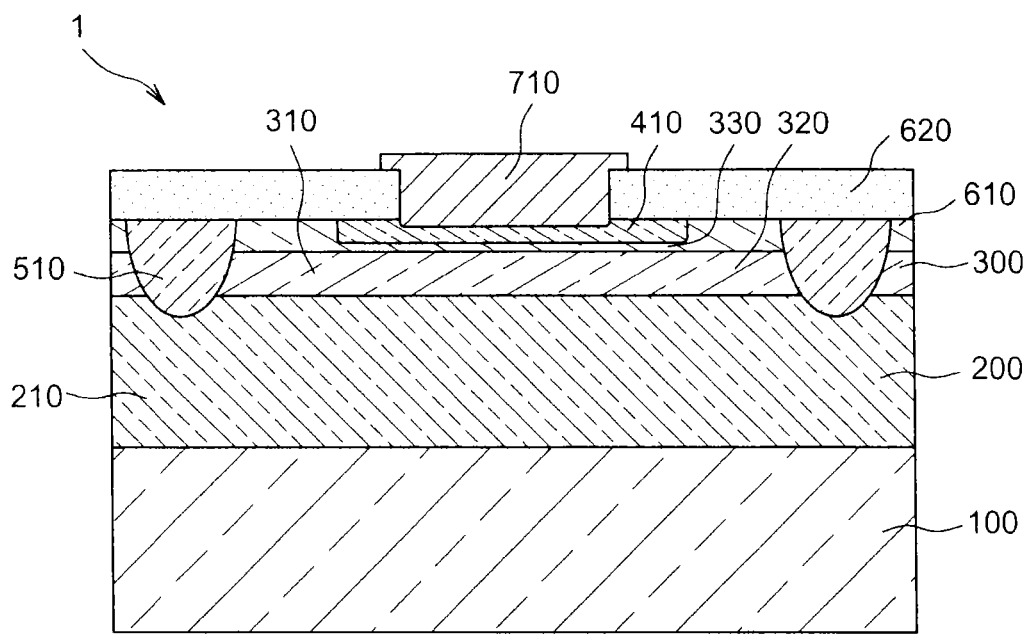
FIG. 2 shows a transverse cross-section view of a structure according to a second embodiment in which the third semiconductor zone is included in the adaptation layer.

FIG. 2 shows a structure 1 according to a second embodiment of the invention. A structure according to this second embodiment differs from a structure 1 according to the first embodiment in that the adaptation layer 610 comprises the entirety of the third zone 410 and therefore the second semiconductor layer 300 does not include part of the third zone 410.

In such a structure 1, the third zone 410 is entirely included in the absorption layer 610. The third zone 410 is in contact with the second zone 310 by means of its minor part 330.

The process for producing a structure 1 according to this second embodiment differs from a process for producing a structure 1 according to the first embodiment in that, in the selective implantation step for forming the third zone 410, only a portion of the absorption layer 610 is implanted.

The principle of operation of a structure 1 according to the second embodiment is substantially identical to that of a structure 1 according to the first embodiment.

Figure 3:
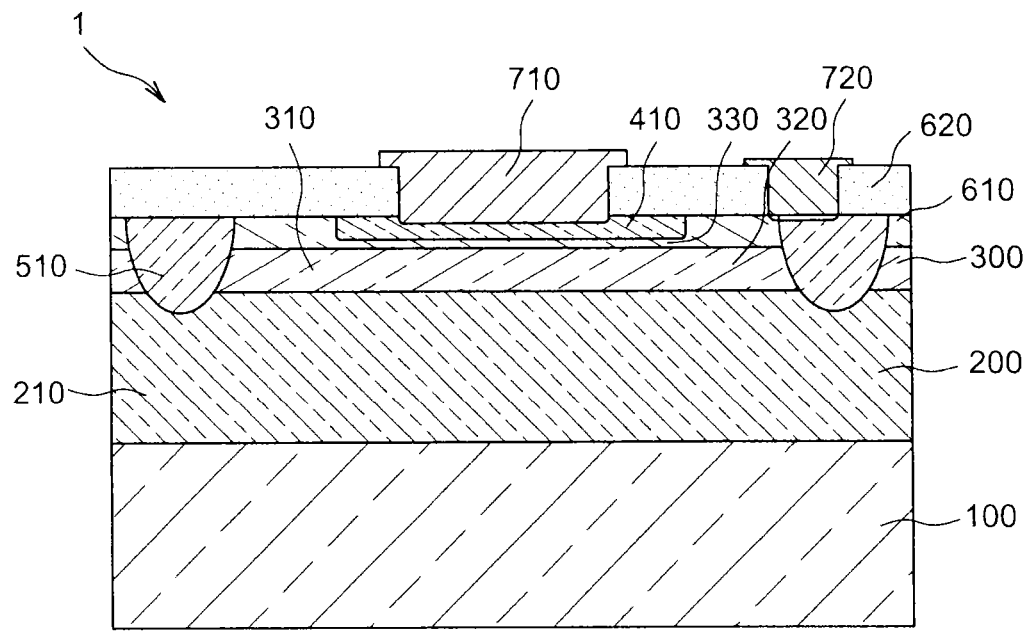
FIG. 3 shows a transverse cross-section view of a structure according to a third embodiment in which the structure comprises a fourth zone suitable for polarizing the absorption zone.

FIG. 3 shows a structure 1 according to a third embodiment in which the polarization of the first zone 210 is obtained through the fourth zone 510. A structure according to this third embodiment differs from a structure 1 according to the second embodiment in that the second polarization means comprise a second electric contact 720 in electrical contact with the fourth zone 510.

According to this third embodiment, the passivation layer 620 comprises a second through-opening communicating with the fourth zone 510. The second electric contact 720 is in contact with the fourth zone 510 through the opening provided in the passivation layer 620.

The second electric contact 720 is made of a conductive material, generally metallic, which is suitable for forming an ohmic contact with the fourth zone 510. Thus, the fourth zone 510, owing to its majority carrier concentration, significantly greater than that of the second zone 310, makes it possible to electrically contact the second electric contact 720 with the first zone 210.

In this third embodiment, the second electric contact 720 and the fourth zone 510 together form the second polarization means.

A process for producing a structure 1 according to the third embodiment differs from a process for producing a structure 1 according to the second embodiment in that the step of forming the second polarization means comprises the sub-steps consisting of:
 forming a second through-opening in the passivation layer 620 in communication with the fourth zone 510,
 forming the second electric contact 720 through the second opening of the passivation layer 620 and in electrical contact with the fourth semiconductor zone 510.

A semiconductor structure 1 according to this third embodiment has an operating principle substantially identical to that of a structure according to the first embodiment.

Figure 4:
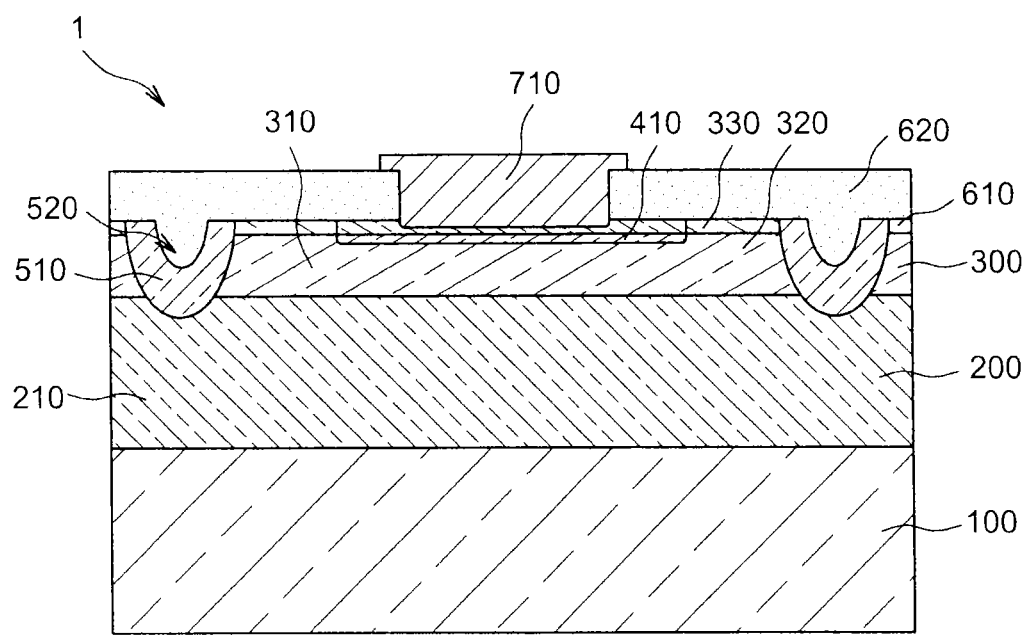
FIG. 4 shows a transverse cross-section view of a structure according to a fourth embodiment in which the structure comprises a lateral cavity that is extended by the fourth zone.

FIG. 4 shows a structure 1 according to a fourth embodiment in which a cavity 520 is provided in the adaptation layer 610 and the second semiconductor layer 300 at the fourth zone 510. A structure 1 according to this fourth embodiment differs from a structure 1 according to the first embodiment in that the adaptation layer 610 and the second semiconductor layer 300 comprise a cavity 520 at the fourth zone 510, the fourth zone 510 extending on each side of said cavity 520.

The cavity 520 passes through the entire adaptation layer 610 and partially passes through the second semiconductor layer 300. The cavity 520 laterally surrounds the second zone 310 over a portion of its thickness.

In this embodiment, the fourth zone 510 extends on each side of the cavity 520 so that the fourth zone 510 forms an interface between the second zone 310 and the cavity 520. The fourth zone 510 is in particular between the cavity 520 and the second zone 310.

A process for producing a structure 1 according to the fourth embodiment differs from a structure 1 according to the first embodiment in that, between the step of forming the adaptation layer 610 and the step of implanting portions of the second semiconductor layer 200 and the adaptation layer 610, which are intended to form the fourth zone 510, the following step is also performed:
 selectively etching the adaptation layer 610 and the second semiconductor layer 200 so as to form the cavity 520.

A structure 1 according to the fourth embodiment has an operating principle substantially identical to that of a structure 1 according to the first embodiment.

Figure 5:
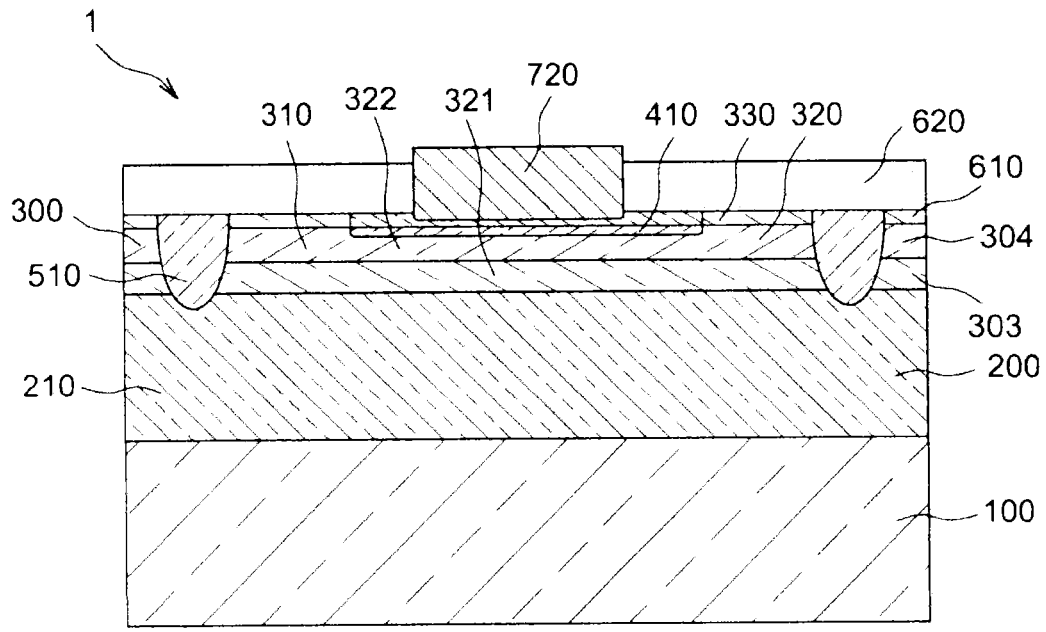
FIG. 5 shows a transverse cross-section view of a structure according to a fifth embodiment in which the structure comprises a second zone, the major part of which includes two sub-parts, FIG. 6 graphically shows the variation in the multiplication rate of a mercury-cadmium telluride multiplication zone of a structure, according to both the polarization voltage of the structure and the cut-off frequency of the second semiconductor layer; it is taken from an article of J. Rothman et Al. published in the Journal of "Electronic Materials" no 42 p. 2928 in 2012.

FIG. 5 shows a structure 1 according to a fifth embodiment in which the second zone 310 comprises a first and a second sub-part 321, 322 adapted so that the second sub-part 322 has a mean carrier multiplication rate per micrometer greater than at least five times that of the first sub-part. A structure according to the fifth embodiment differs from a structure according to the first embodiment in that the second zone is suitable for providing a carrier multiplication by impact ionization, which is predominant for one type of carrier, and in that it comprises a first and a second sub-part formed, respectively, in a first and a second sub-layer 303, 304 of the second semiconductor layer 300.

In this fifth embodiment, the second layer 300 comprises a first and a second sub-layer 303, 304. The first and the second sub-layer 303, 304 are the sub-layers by which the second layer 300 is in respective contact with the first semiconductor layer 200 and the adaptation layer 610.

The first and the second sub-layer 303, 304 respectively comprise the first and the second sub-parts 321, 322 of the major part 320 of the second zone 310.

The first and the second sub-layers are adapted so that the second sub-part 322 has a mean carrier multiplication rate per micrometer greater than that of the first sub-part 321, preferably greater than 3 times, 5 times, and even 10 times that of the first sub-part 321. To this effect, the second sub-layer 304 comprises a forbidden energy gap lower than that of the first sub-layer 303.

The values of the ratio of mean carrier multiplication rates per micrometer provided above are consistent in operation of the structure. The structure is considered to be in operation during its polarization at a nominal operating voltage, such as, for example, 12 V.

Similarly, for a first and a second sub-part 321, 322 having thicknesses on the same order of amplitude, or preferably substantially identical, a carrier multiplication ratio between said first and second sub-parts 321, 322 is equivalent to the ratio of mean carrier rates per micrometer between these two same sub-parts 321, 322. Thus, in this configuration of the first and second sub-parts, the second sub-part 322 has a carrier multiplication rate at least greater than 3 times, 5 times, and preferably 10 times the mean carrier multiplication rate of the first sub-part 321.

Figure 6:
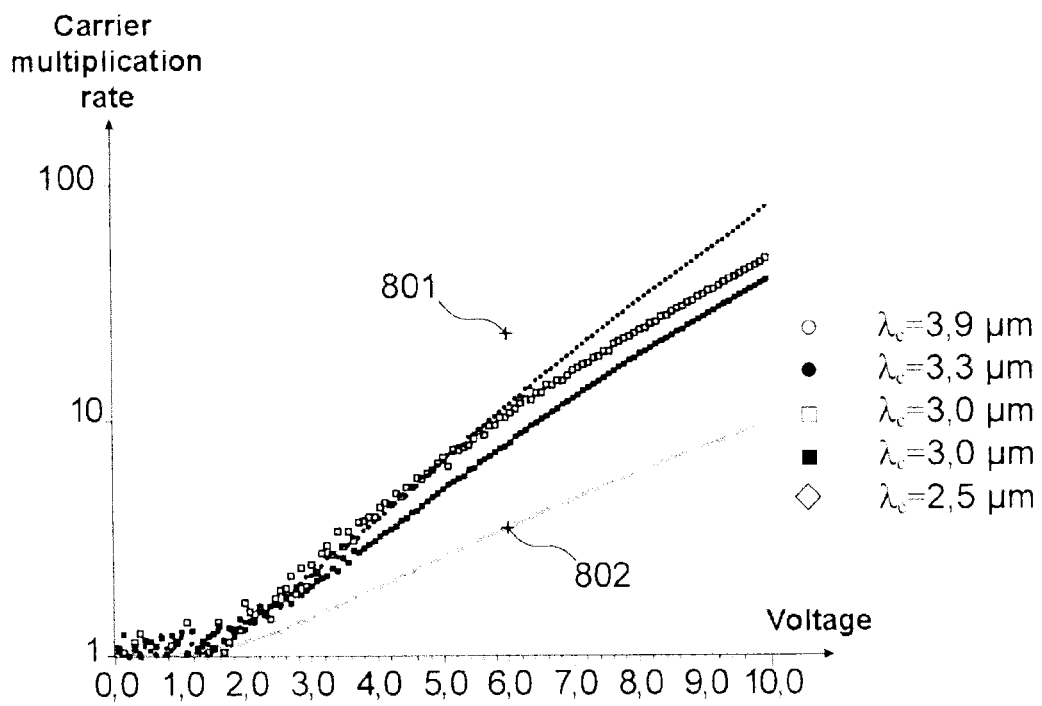

FIG. 6 thus graphically shows the variation in the mercury-cadmium telluride carrier multiplication rate of a structure according to both the cut-off wavelength $\lambda_c$ of said zone, which corresponds directly to the forbidden energy gap of this same zone, and the polarization voltage of the structure. This FIG. 6 comes from an article of J. Rothman et Al. published in the Journal of Electronic Materials no 42 p. 2928 in 2012. For a structure comprising a first and a second sub-part 321, 322 each having characteristics identical to that of a multiplication zone of FIG. 6 and for a polarization voltage of 12 V applied to the structure, the voltage drop will be distributed equivalently along the two sub-parts 321, 322. Thus, the multiplication rates along such first and second sub-parts with such a polarization voltage correspond to those of multiplication zones according to FIG. 6, which comprise the same cut-off wavelengths $\lambda_c$ at the polarization voltage of the structure divided by two, i.e. a voltage of 6 V.

Thus, for example, for a first sub-part 321 of which the cut-off length $\lambda_c$ is 2.5 µm, which corresponds to a forbidden energy gap of 0.45 eV and a second sub-part 322 of which the cut-off wavelength $\lambda_c$ is 3.9 µm, which corresponds to a forbidden energy gap of 0.32 eV, the multiplication rates are respectively 2 (see point 802 in FIG. 4) and 20 (see point 801 in FIG. 4). Therefore, ratios of carrier multiplication rates between the first and second sub-parts 321, 322 and mean carrier multiplication rates between these two same parts equal to 10 are obtained.

To obtain these conditions, in the specific application, the first and second sub-layer 303, 304 are both made of mercury-cadmium telluride of the $Cd_x Hg_{1-x}Te$ type with cadmium proportions $x_1$, $x_2$ respectively between 0.6 and 0.33, and between 0.42 and 0.2. The thicknesses of the first and second sub-layer 303, 304 are respectively between 0.5 and 1 µm and between 0.5 and 2 µm. The first and second sub-layers have a second type of conductivity of which the majority carriers are electrons. The majority carrier concentrations of the first and second sub-layer are substantially identical and are between $10^{14}$ and $10^{15}$ cm$^{-3}$.

In the specific application, the first and second sub-layer 303, 304 are both made of a mercury-cadmium telluride of the $Cd_xHg_{1-x}Te$ type with cadmium proportions respectively between 0.6 and 0.4 and between 0.42 and 0.2. The respective thicknesses of the first and second sub-layer are respectively between 0.5 and 1 µm and between 0.5 and 2 µm. The first and second sub-layers have a second type of conductivity of which the majority carriers are electrons. The majority carrier concentration of the first and that of the second sub-layer are substantially identical and are between $10^{14}$ and $10^{15}$ cm$^{-3}$.

According to this possibility of the invention, the forbidden energy gap of the second sub-layer 304 can be suitable for allowing the absorption of electromagnetic radiation by the second sub-layer 304 in a second wavelength range of which the energy is below the given wavelength range. With such a possibility, the structure 1 enables, during operation, the detection and measurement of radiation of which the wavelength is in the second wavelength range in addition to the radiation measurement at the given wavelength range.

According to this possibility applied to the specific application, the cadmium proportion of the second sub-layer can be between 0.32 and 0.2 in order to provide a second wavelength range including the thermal radiation.

A process for producing a structure according to this fifth embodiment differs from a process for producing a structure according to the first embodiment in that the step of forming the second layer consists of:

forming, in contact with the second face 202 of the first layer 200, the second semiconductor layer 300, the second layer 300 having the second type of conductivity and comprising a first and a second face 301, 302, the second layer 300 being in contact with the first layer 200 by its first longitudinal face 301, in this step of forming the composition of the layer varied so as to form the first and second sub-layers 303, 304.

According to an alternative of this embodiment not shown, the first and second layers 303, 304 are separated from one another by an interface zone having the first type of conductivity of which the majority carrier concentration is suitable for modifying the distribution of the electric field in the second sub-part so that the latter has a mean carrier multiplication rate per micrometer greater than that of the first sub-part, the second sub-part having a mean carrier multiplication rate per micrometer greater than at least 3 times and preferably 5 times and even 10 times that of the first sub-part. According to this alternative, the first and the second sub-layers 303, 304 have substantially identical forbidden energy gap and have the second type of conductivity with a majority carrier concentration on the same order of amplitude.

Figure 7:
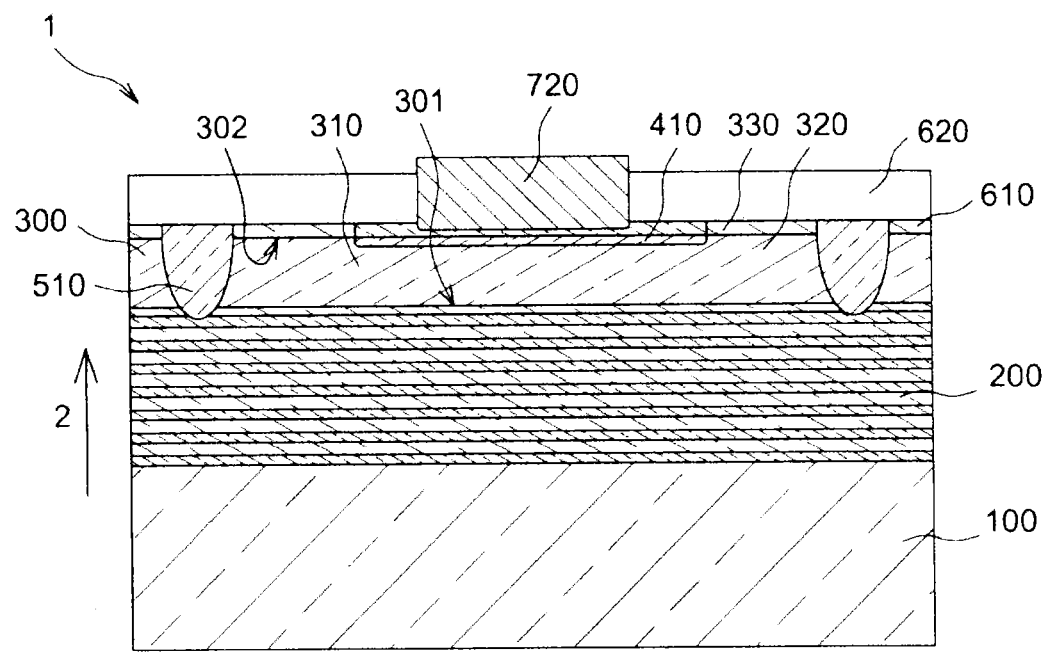
FIG. 7 shows a transverse cross-section view of a structure according to a sixth embodiment in which the structure comprises a first semiconductor zone suitable for absorbing electromagnetic radiation over an expanded range of wavelengths.

FIG. 7 shows a structure 1 according to a sixth embodiment in which the first semiconductor layer 200 comprises arsenic of which the concentration is varied alternately in a direction substantially perpendicular to the first longitudinal face 301 between a so-called low concentration and a so-called high concentration.

Figure 8:
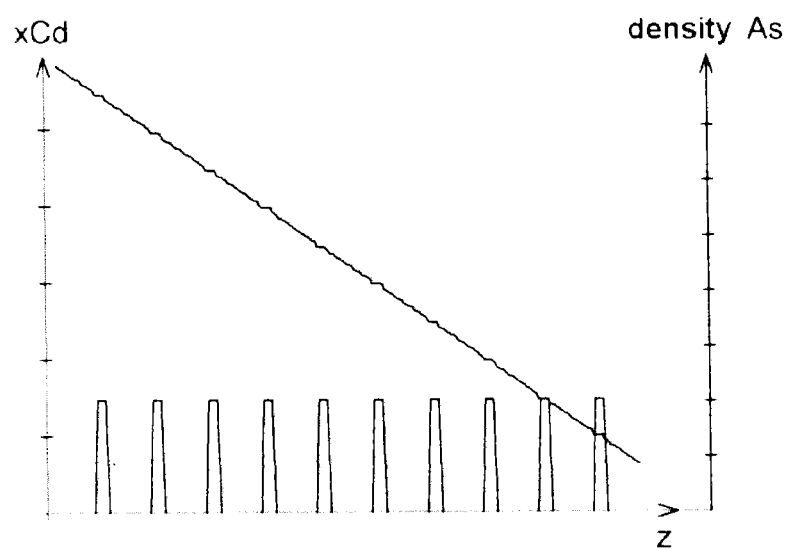
FIG. 8 shows, in the form of a graph, the variation in the arsenic concentration and the cadmium proportion in the first zone of a structure as shown in FIG. 6.

A structure 1 according to this sixth embodiment differs from a structure 1 according to the first embodiment in that it comprises a first zone 210 comprising a suitable doping element providing at least one majority carrier corresponding to the first type of conductivity, such as arsenic, of which the concentration is varied, as shown in FIG. 8, alternately in the direction perpendicular to the length between a so-called low concentration and a so-called high concentration and in that this same first zone 210 is made of mercury-cadmium telluride of the $Cd_xHg_{1-x}Te$ type with a cadmium proportion x that is varied.

Because said doping element is preferably arsenic, only arsenic is mentioned above. As an alternative to arsenic, the first layer 200 can comprise a different doping element, such as gold Au or antimony Sb, according to a configuration similar to that described below.

In this sixth embodiment, the first layer 200 has a thickness of between 0.5 and 2 µm.

The first layer 200 has a first type of conductivity for which the majority carriers are electrons.

The majority carriers in the first layer 200 are provided by means of the doping element, which is arsenic. The arsenic concentration along the first layer 200 is varied alternately along the thickness of the first layer between a so-called low concentration and a so-called high concentration. The alternation between the low concentration and the high concentration is substantially periodic.

Each period comprises a first part corresponding to the high concentration and a second part corresponding to the low concentration with a dimensional ratio between the first part and the second part in the direction perpendicular to the length, which is a maximum of 10 and typically below 5.

The so-called low concentration is substantially zero in order to limit the risks of diffusion of cadmium along the thickness of the first layer, thus the parts of the zone having a low-type concentration are of the intrinsic type.

The so-called high arsenic concentration is sufficient for the carriers provided by the pars corresponding to the high concentration to influence the parts corresponding to the low concentration. Thus, the arsenic concentration is adapted so that the majority carrier concentration of a material comprising such an arsenic concentration is more than 20 times that of this same material when it is of the intrinsic type.

In the first semiconductor layer, the so-called high arsenic concentration, the period and the dimensional ratio between a part corresponding to the high concentration and a part corresponding to the low concentration in the direction substantially perpendicular to the first longitudinal face 301 are adapted so that the majority carrier concentration in the first layer has a low series resistance.

According to a preferred possibility of this sixth embodiment, the first zone 210 is in contact with the second zone 310 by a region substantially free of arsenic. According to this same possibility, the region of the first zone 210 by which the first zone 210 is in contact with the second zone 310 can comprise a cadmium proportion x that is varied in the direction of the second zone 310.

A process for producing a structure 1 according to this sixth embodiment differs from a process for producing a structure 1 according to the first embodiment in that the step of providing the support consists of:

providing a semiconductor support 100 and the first semiconductor layer 200, the first semiconductor layer 200 having the first type of conductivity with an arsenic concentration that is varied alternately between the high concentration and the low concentration, with the first layer comprising a first and a second face 201, 202.

The invention claimed is:

1. Avalanche photodiode-type semiconductor structure intended to receive electromagnetic radiation in a given wavelength and comprising:

a first semiconductor zone, called an absorption zone, with a first type of conductivity having a first face intended to receive the electromagnetic radiation and a second face opposite the first face, the semiconductor material in which said first zone is formed having a forbidden energy gap suitable for allowing electromagnetic radiation to be absorbed by said first zone, at least one second semiconductor zone, called a multiplication zone, in contact on a first longitudinal face with the second face of the first zone, the second zone having a majority carrier concentration lower than that of the first zone, and being suitable for multiplying the carriers by impact ionization, a third semiconductor zone, called a collection zone, in contact with the second semiconductor zone, said third zone having a second type of conductivity opposite the first type of conductivity and having a majority carrier concentration higher than that of the second semiconductor zone, delimitation means suitable for laterally delimiting the second zone, wherein the delimitation means comprise a fourth semiconductor zone surrounding the second zone and comprising a forbidden energy gap of energy higher than that of a major part of the second zone, said fourth zone having the first type of conductivity with a majority carrier concentration greater than that of the second zone.

2. Structure according to claim 1, wherein the second and fourth zones are both essentially formed by at least three of the same elements, said at least three elements being adapted so that the variation in the proportion of at least one of said at least three elements causes a forbidden energy gap variation, the respective proportions of said at least one element of the second and fourth zones being adapted so that the fourth zone has a forbidden energy gap greater than that of the second zone.

3. Structure according to claim 2, wherein the at least three elements are tellurium, cadmium and mercury, the cadmium proportion of the second and the fourth zones being adapted so that the fourth zone has a forbidden energy gap greater than that of the second zone.

4. Structure according to claim 1, wherein the structure also comprises an adaptation layer and a passivation layer, the adaptation layer comprising a part, called a minor part, of the second zone and being in contact with a part, called a major part, of the second zone, this same adaptation layer having a forbidden energy gap of which the energy is between that of the passivation layer and that of the major part of the second zone.

5. Structure according to claim 4, wherein the adaptation layer is made of a mercury-cadmium telluride of the $Cd_xHg_{1-x}Te$ type of which the cadmium proportion x is greater than that of the major part of the second zone.

6. Structure according to claim 4, wherein the adaptation layer comprises at least a part of the third semiconductor zone.

7. Structure according to claim 6, wherein the adaptation layer comprises the entire third zone.

8. Structure according to claim 1, wherein first and second polarization means suitable for polarizing, respectively, the third and the first semiconductor zones are provided, the second polarization means comprising the fourth zone and an electric contact in electrical contact with the fourth zone, the fourth zone enabling the first zone and the electric contact to be electrically connected.

9. Structure according to claim 1, wherein the delimitation means also comprise a cavity laterally surrounding, over at least a part of its thickness, the second zone, the fourth zone being between the cavity and the second zone.

10. Structure according to claim 1, wherein the second zone is suitable for providing a carrier multiplication by impact ionization, which is predominant for one type of carrier and negligible for the other type of carrier, and wherein the second zone comprises at least two sub-parts of its major part, the first sub-part by which the second zone is in contact with the first zone, the second sub-part being adapted so as to have a mean carrier multiplication rate per micrometer greater than the mean carrier multiplication rate per micrometer of the first sub-part, and that is greater than 3 times, 5 times or even 10 times the mean carrier multiplication rate per micrometer of the first sub-part.

11. Structure according to claim 10, wherein the second sub-part is made of a semiconductor material having a forbidden energy gap lower than that of the semiconductor material in which the first sub-part is formed so as to have a mean carrier multiplication rate per micrometer greater than that of the first sub-part.

12. Structure according to claim 1, wherein the semiconductor material of which the first zone is made is a mercury-cadmium telluride of which the cadmium composition is varied so as to promote the absorption of radiation, and wherein the first zone comprises a doping element providing at least one majority carrier corresponding to the first type of conductivity, the concentration of said doping element being varied alternately in a direction substantially perpendicular to the first longitudinal face between a so-called low concentration and a so-called high concentration.

13. Structure according to claim 1, wherein the structure is also intended to receive electromagnetic radiation in a second wavelength range of energies below those of the given wavelength range, the major part of the second zone comprising a sub-part having a forbidden energy gap lower than that of the first semiconductor zone and which is suitable for promoting the absorption of the electromagnetic radiation in the second wavelength range.

14. Method for producing an avalanche photodiode-type structure, said method comprising the steps of:
providing a support comprising a first semiconductor zone with a first type of conductivity having a first face intended to receive the electromagnetic radiation and a second face opposite the first face, the semiconductor material of which said first zone is made having a forbidden energy gap adapted so as to allow the absorption of the electromagnetic radiation in said first zone,
forming at least one second semiconductor zone in contact on a first longitudinal face with the second face of the first zone, the second zone having a majority carrier concentration lower than that of the first zone,
forming a third semiconductor zone in contact with the second semiconductor zone, said third zone having a second type of conductivity opposite the first type of conductivity and having a majority carrier concentration greater than that of the second semiconductor zone,
forming a fourth semiconductor zone surrounding the second zone and comprising a forbidden energy gap greater than the forbidden energy gap of a major part of the second zone, said fourth zone having the first type of conductivity with a majority carrier concentration greater than that of the second zone, said fourth zone forming means for delimiting the second zone.

15. Method according to claim 14, the structure comprising an adaptation layer, the first and fourth zones as well as the adaptation layer being made of mercury-cadmium tellurides of the $Cd_xHg_{1-x}Te$ type, and the step of forming the second zone comprising the sub-steps consisting of:
forming the adaptation layer in contact with a major part of the second semiconductor zone, the cadmium proportion x being adapted so that the adaptation layer has a forbidden energy gap greater than that of the second zone,
implanting the portions of the structure intended to form the fourth zone with arsenic so as to provide a majority carrier concentration greater than that of the second semiconductor zone,
performing an activation anneal so as to diffuse a part of the cadmium from the adaptation layer in said portions of the structure so as to form the fourth zone.

* * * * *